United States Patent
Lin et al.

(10) Patent No.: US 9,995,999 B2
(45) Date of Patent: Jun. 12, 2018

(54) LITHOGRAPHY MASK

(71) Applicant: TAIWAN SEMICONDUCTOR MANUFACTURING COMPANY, LTD., Hsin-Chu (TW)

(72) Inventors: Yun-Yue Lin, Hsinchu (TW); Hsin-Chang Lee, Zhubei (TW); Chia-Jen Chen, Jhudong Township, Hsinchu County (TW); Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 58 days.

(21) Appl. No.: 15/181,066

(22) Filed: Jun. 13, 2016

(65) Prior Publication Data
US 2016/0299419 A1    Oct. 13, 2016

Related U.S. Application Data

(63) Continuation of application No. 14/158,068, filed on Jan. 17, 2014, now Pat. No. 9,366,953.

(51) Int. Cl.
*G03F 1/22* (2012.01)
*G03F 1/24* (2012.01)
*G03F 1/48* (2012.01)

(52) U.S. Cl.
CPC ..................... *G03F 1/48* (2013.01)

(58) Field of Classification Search
None
See application file for complete search history.

(56) References Cited

U.S. PATENT DOCUMENTS

| 8,475,977 B2 | 7/2013 | Deweerd |
| 2007/0292772 A1 | 12/2007 | Charpin-Nicolle et al. |
| 2009/0130569 A1 | 5/2009 | Quesnel |

*Primary Examiner* — Stephen Rosasco
(74) *Attorney, Agent, or Firm* — Haynes and Boone, LLP

(57) ABSTRACT

A lithography mask includes a substrate, a reflective multi-layer (ML) on the substrate, and a barrier layer on the reflective ML. The barrier layer includes at least one material selected from the group consisting of ruthenium nitride, hafnium oxide, aluminum nitride, boron carbide, boron nitride, and a combination thereof.

20 Claims, 5 Drawing Sheets

LITHOGRAPHY MASK

PRIORITY INFORMATION

This application is a continuation of U.S. patent application Ser. No. 14/158,068 filed Jan. 17, 2014 and entitled "Lithography Mask," the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased.

This scaling down process generally provides benefits by increasing production efficiency and lowering associated costs. Such scaling down has also increased the complexity of processing and manufacturing ICs. For these advances to be realized, similar developments in IC processing and manufacturing are needed. For example, extreme ultraviolet (EUV) lithography is often implemented to provide a higher resolution lithography process. Masks used in EUV (and other high-resolution) lithography may present new challenges.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
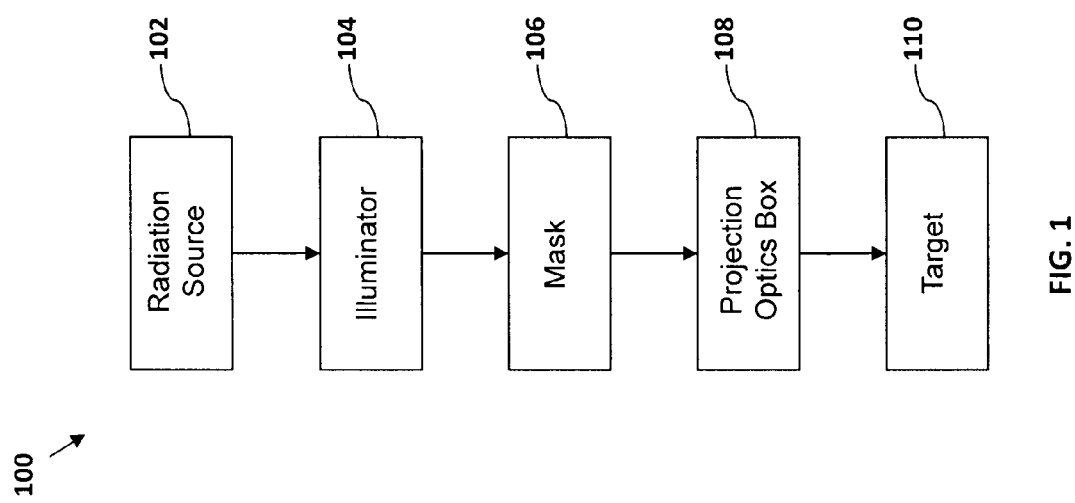
FIG. 1 is a block diagram of a lithography process for implementing one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a lithography system 100 for implementing one or more embodiments of the present disclosure. In some embodiments, the lithography system 100 may be a EUV lithography system 100. As shown in FIG. 1, the EUV lithography system 100 includes a radiation source 102, an illuminator 104, a mask 106 (in the present disclosure, the terms of mask, photomask, and reticle are used to refer to the same item), a projection optics box (POB) 108, and a target 110 such as a semiconductor wafer on a substrate stage. However, other configurations and inclusion or omission of devices may be possible.

The radiation source 102 of the EUV lithography system 100 may include a source providing electromagnetic radiation having a wavelength in the EUV range. For example, the radiation source 102 may provide EUV radiation having a wavelength of approximately 13.5 nm. The illuminator 104 may comprise refractive optics, such as a single lens or a lens system having multiple lenses (zone plates) and/or reflective optics, such as a single mirror or a mirror system having multiple mirrors in order to direct light from the radiation source 102 onto the mask 106. The mask 106 can be a transmissive mask or a reflective mask. In some embodiments, the mask 106 is a reflective mask such as described in further detail below. The mask 106 may incorporate other resolution enhancement features such as features for phase-shifting mask (PSM) and/or optical proximity correction (OPC).

The electromagnetic radiation reflected from the mask 106 may form a patterned radiation beam that is collected by the POB 108. The POB 108 may have refractive optics or reflective optics. The POB 108 may include a magnification of less than one (thereby reducing the patterned image included in the radiation). The POB 108 directs the patterned radiation to the target 110 (e.g., a semiconductor wafer). The target 110 includes a photosensitive layer (e.g., photoresist or resist), which is sensitive to the EUV radiation. The target 110 may be held by a target substrate stage. The target substrate stage provides control of the target substrate position such that the image of the reticle is scanned onto the target substrate in a repetitive fashion (though other lithography methods are possible). The lithography system 100 or portion(s) thereof may include a vacuum atmosphere.

Figure 2B:
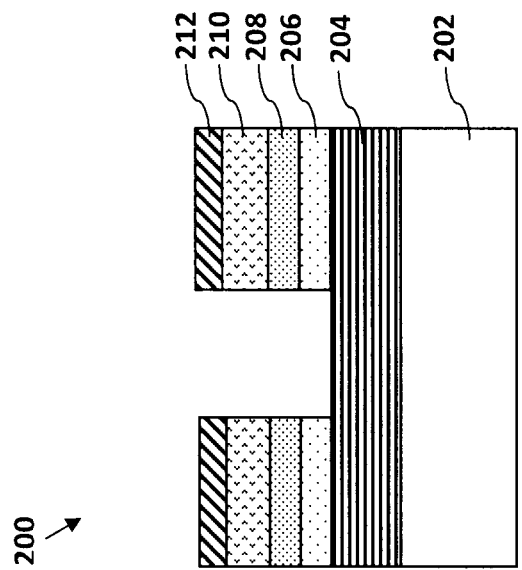
FIGS. 2A-2B are cross sectional views of the lithography mask at various fabrication stages according to one or more embodiments of the present disclosure.
Figure 2A:
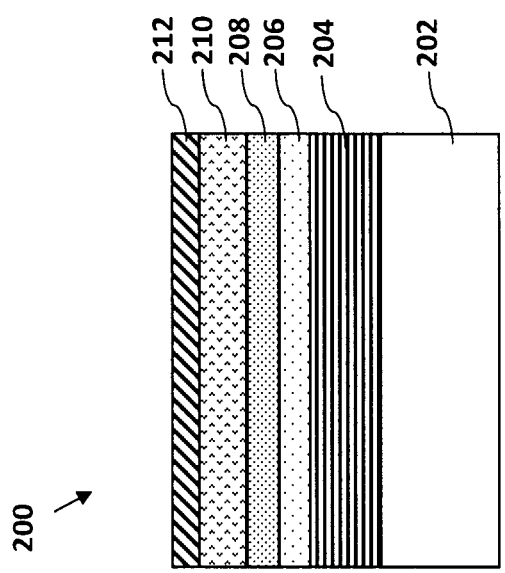

FIGS. 2A-2B are cross sectional views of a lithography mask 200 at different fabrication stages using a method 400 of FIG. 4 as discussed later in the present disclosure. As shown in FIG. 2A, a substrate 202 is provided in a blank mask 200. The substrate 202 may include low thermal expansion material (LTEM). The substrate 202 serves to minimize image distortion due to mask heating induced by the intensified illumination radiation. The LTEM may include fused silica, fused quartz, calcium fluoride, silicon carbide, silicon oxide-titanium oxide, and/or other suitable LTEM known in the art. The substrate 202 may include materials with a low defect level and a smooth surface.

The blank mask 200 also includes a reflective multilayer (ML) 204 deposited on the substrate 202. In some embodiments, the reflective ML 204 includes a plurality of film pairs, such as molybdenum-silicon (Mo/Si) film pairs (e.g., a layer of molybdenum above or below a layer of silicon in each film pair). In some embodiments, the reflective ML 204 includes molybdenum-beryllium (Mo/Be) film pairs, or any material that is highly reflective at EUV wavelengths can be utilized for the reflective ML 204. Light reflection occurs when light propagates across the interface between two materials of different refractive indices. The reflected light is greater when the difference of refractive indices of the multiple films of the reflective ML 204 is greater, such as the refractive indices between Si and Mo. To increase the reflected light, one may increase the number of interfaces by depositing the reflective ML 204 of alternating materials and let light reflected from different interfaces interfere constructively by choosing appropriate thicknesses for each layer inside the reflective ML 204. However, the absorption of the employed materials for the reflective ML 204 limits the highest reflectivity that can be achieved. The thickness of each layer of the reflective ML 204 depends on the EUV wavelength and the incident angle. The thickness of the reflective ML 204 is adjusted to achieve a maximum constructive interference of the EUV light reflected at each interface and a minimum absorption of the EUV light by the reflective ML 204. The reflective ML 204 may be selected such that it provides a high reflectivity to a selected radiation type/wavelength. A typical number of film pairs are in a range from about 20 pairs to about 80 pairs, however any number of film pairs is possible. In some embodiments, the reflective ML 204 includes about 40 pairs of layers of Mo/Si films. In some embodiments, each Mo/Si film pair has a thickness of about 7 nm, with a total thickness of about 280 nm, and thereby a reflectivity of about 70% is achieved. In some embodiments, each film of the Mo/Si film pair, for example, the Mo film or the Si film has a thickness in a range from about 2 nm to about 5 nm.

The blank mask 200 further includes a barrier layer 206 deposited on the reflective ML layer 204. The barrier layer 206 may serve to prevent inter-diffusion between the reflective ML 204 and the capping layer 208 of the lithography mask 200 of FIGS. 2A-2B, or between the reflective ML 204 and the absorber layer 210 of the lithography mask 300 of FIGS. 3A-3B. In some embodiments, the barrier layer 206 may include ruthenium (Ru), hafnium (Hf), aluminum (Al), boron (B), and their oxide compounds, nitride compounds or alloys. For example, the barrier layer 206 may include materials such as $M1_xO_y$, $M1_xN_y$, and/or $M1_xM2_y$ where M1 or M2 is an element selected from Ru, Hf, Al, B, and any other suitable metallic elements. The values of x and y may be any suitable values. In some embodiments, the barrier layer 206 may include one or more materials selected from the group consisting of ruthenium nitride, hafnium oxide, aluminum nitride, boron carbide, boron nitride and combinations thereof. In some embodiments, the barrier layer 206 has adequate etching selectivity in comparison with the absorber layer 210, so that the absorber layer 210 can be selectively etched in a subsequent etching process. In some embodiments, the barrier layer 206 also has adequate etching selectivity in comparison with the ML 204, so that the barrier layer 206 can be selectively etched while leaving ML 204 unetched in one or more subsequent etching processes. In some embodiments, the barrier layer 206 may include a material having a hexagonal crystal structure. In some embodiments, the thickness of the barrier layer 206 may be less than or equal to about 10 nm. In some embodiments, the thickness of the barrier layer 206 may be in a range from about 1 nm to about 3 nm. In some embodiments, the thickness of the barrier layer 206 may affect the EUV light absorption. For example, when the thickness of the barrier layer 206 is greater than 10 nm, the intensity of the EUV light may degrade.

Still referring to the blank mask 200 of FIG. 2A, a capping layer 208 is deposited on the barrier layer 206. In some embodiments, the capping layer 208 may include ruthenium (Ru) or Ru compounds, such as ruthenium-boron or ruthenium-silicon. In some embodiments, the capping layer 208 has a thickness less than or equal to about 10 nm. In some embodiments, the capping layer may not be stable, which results in process uncertainty, capping layer damage, or inter-diffusion between the capping layer and the ML 204. In some embodiments of the present disclosure, after forming the barrier layer 206 between the capping layer 208 and the ML 204, the barrier layer 206 can provide adequate etching selectivity in comparison the ML 204 so that the barrier layer 206 can be selectively etched while leaving the ML 204 unetched in the subsequent processes. The barrier layer 206 can also prevent the inter-diffusion between the ML 204 and the capping layer 208.

The blank mask 200 further includes an absorber layer 210 deposited on the capping layer 208. In some embodiments, the absorber layer 210 absorbs a radiation beam projected on it. The absorber layer 210 may include a single layer or multiple layers selected from a group of chromium (Cr) layer, chromium oxide layer, titanium nitride layer, tantalum nitride layer, tantalum (Ta) layer, titanium (Ti) layer, aluminum-copper (Al—Cu) layer, palladium (Pd) layer, tantalum boron nitride layer, aluminum oxide layer, molybdenum (Mo) layer, and other suitable layers. In some embodiments, the absorber layer 210 has a thickness in a range from about 20 nm to about 100 nm.

In some embodiments, an anti-reflection layer 212 may also be formed on the absorber layer 210. The anti-reflection layer 212 may be formed to ensure low reflectance of the inspection light to be used for inspection of the lithography mask pattern. In some embodiments, the anti-reflection layer 212 may include one or more materials selected from the group consisting of tantalum oxide, tantalum boron oxide, and a combination thereof. In some embodiments, the anti-reflection layer 212 has a thickness less than or equal to about 20 nm. In some embodiments, the lithography mask may not include the anti-reflection layer.

In some embodiments, a protection layer (not shown) may be further deposited on the absorber layer 210. In some embodiments, the protection layer may protect the absorber layer 210 from oxidation of the high absorbing material when the mask is in a cleaning process. Furthermore, some of the absorber layer 210 may have poor clean resistance and the protection layer may enhance the cleaning durability. In some embodiments, the lithography mask may not include the protection layer.

Referring to FIG. 2B, the lithography mask 200 may be formed by etching the barrier layer 206, the capping layer 208, the absorber layer 210, and the anti-reflection layer 212. In some embodiments, portions of the barrier layer 206, the capping layer 208, the absorber layer 210, and the anti-reflection layer 212 may be removed to form the final pattern of the lithography mask 200 as shown in FIG. 2B. The process for forming the lithography mask 200 is discussed in details later in the present disclosure.

Figure 3B:
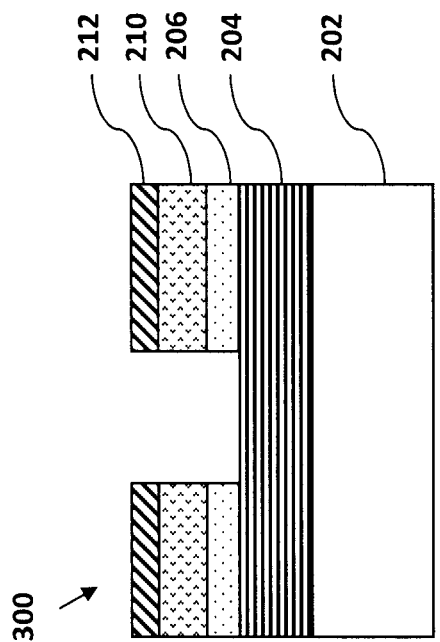
FIGS. 3A-3B are cross sectional views of the lithography mask at various fabrication stages according to one or more embodiments of the present disclosure.
Figure 3A:
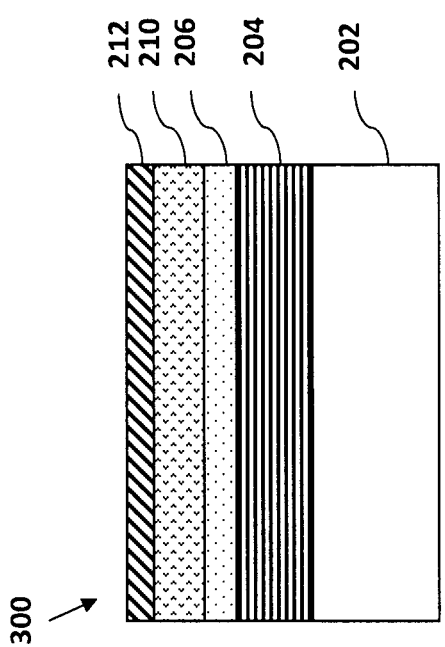

FIGS. 3A-3B are cross sectional views of a lithography mask 300 at different fabrication stages in the present disclosure. The lithography mask 300 may be an alternative embodiment of the lithography mask 200 as discussed with respect to FIGS. 2A-2B.

Referring to FIG. 3A, the blank mask 300 includes a substrate 202, a reflective ML 204 deposited on the substrate 202, a barrier layer 206 deposited on the reflective ML 204, an absorber layer 210 deposited on the barrier layer 206, and an anti-reflection layer 212 deposited on the absorber layer 210. In some embodiments, the substrate 202, the reflective ML 204, the barrier layer 206, the absorber layer 210, and the anti-reflection layer 212 of blank mask 300 are substantially similar to the substrate 202, the reflective ML 204, the barrier layer 206, the absorber layer 210, and the anti-reflection layer 212 respectively of blank mask 200, as discussed with respect to FIG. 2A. In some embodiments, a protection layer (not shown) may further be deposited on the absorber layer 210 during the fabrication of the lithography mask 300.

Referring to FIG. 3B, portions of the barrier layer 206, the absorber layer 210, and the anti-reflection layer 212 are removed to form the lithography mask 200 as shown in FIG. 3B. The process for forming the lithography mask 200 of FIG. 3B is discussed later in detail with respect to method 400 of FIG. 4 according to one or more embodiments of the present disclosure.

Various masks can be fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber layer (e.g., the absorber layer 210) is present and an incident light beam is almost fully absorbed by the absorber layer (e.g., the absorber layer 210). The absorber layer can be made of materials containing chromium, chromium oxide, chromium nitride, aluminum-copper, titanium, titanium nitride, tantalum, tantalum oxide, tantalum nitride, and/or tantalum boron nitride. In the reflective region, the absorber is removed and the incident light is reflected by a reflective ML (e.g., the reflective ML 204). An example PSM includes an absorptive region (e.g., the absorber layer 210) and a reflective region (e.g., the reflective ML 204). A portion of the incident light reflects from the absorptive region (e.g., the absorber layer 210) with a proper phase difference with respect to a light reflected from the reflective region to enhance the resolution and imaging quality. The absorber region (e.g., the absorber layer 210) of the PSM can be made by materials such as tantalum nitride and tantalum boron nitride at a specific thickness. In some embodiments, the PSM is an attenuated PSM (AttPSM) or an alternating PSM (AltPSM).

Figure 4:
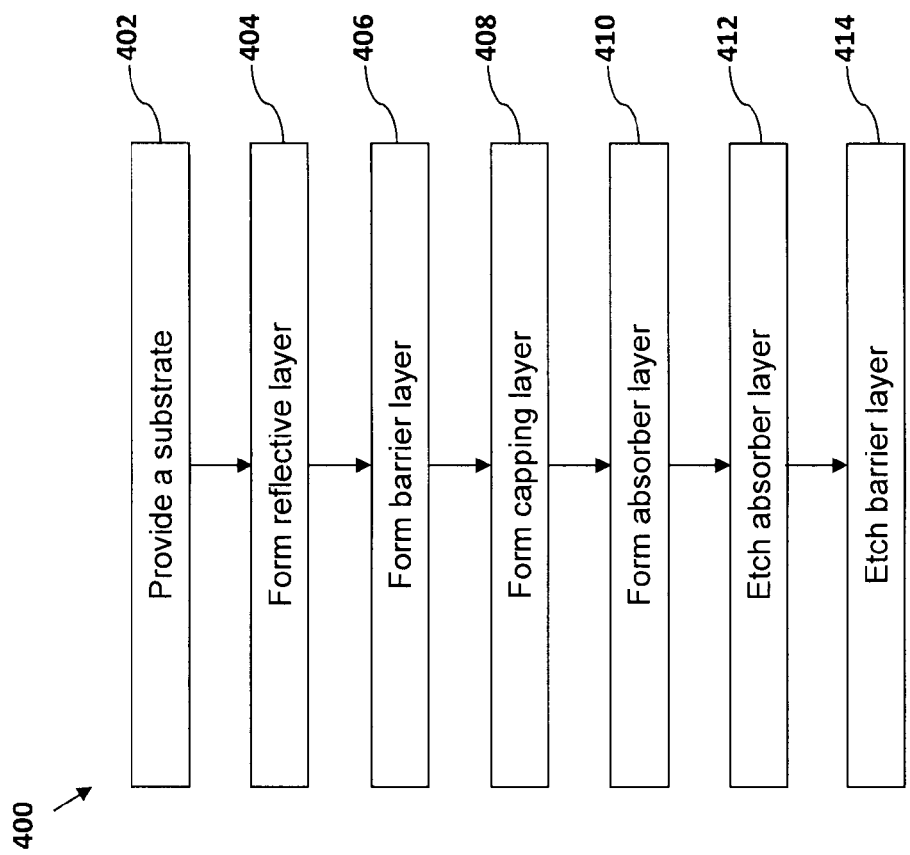
FIG. 4 is a flow chart showing a method for fabricating a lithography mask according to one or more embodiments of the present disclosure.

FIG. 4 illustrates a method 400 for fabricating a lithography mask (e.g. lithography mask 200 of FIGS. 2A-2B or mask 300 of FIGS. 3A-3B) according to one or more embodiments of the present disclosure. The method 400 may include two processes: a blank mask fabrication process and a mask patterning process. The blank mask fabrication process may include steps 402-410 as shown in FIG. 4. A blank mask is formed by depositing a plurality of suitable layers on a suitable substrate. The mask patterning process may include steps 412-414 of FIG. 4. The blank mask is patterned to have a design of a layer of an integrated circuit (IC) device (or chip). The patterned mask is then used to transfer circuit patterns (e.g., the design of a layer of an IC device) onto a semiconductor wafer. The patterns can be transferred onto multiple wafers for multiple times through various lithography processes. Several masks (for example, a set of 15 to 30 masks) may be used to construct a complete IC device.

The method 400 starts at step 402 by providing the substrate 202 for the lithography mask 200 or mask 300. The method 400 proceeds to step 404 by forming the reflective multilayer (ML) 204 on the substrate 202. In some embodiments, the reflective ML 204 may be formed by one or more processes selected from the group consisting of physical vapor deposition (PVD), chemical vapor deposition (CVD), atomic layer deposition (ALD), laser deposition, ion beam deposition, spin-on coating process, metal-organic decomposition (MOD), and combinations thereof.

The method 400 proceeds to step 406 by forming the barrier layer 206 on the reflective ML 204. In some embodiments, the barrier layer 206 may be formed by one or more processes selected from the group consisting of PVD, CVD, ALD, laser deposition, ion beam deposition, spin-on coating process, MOD, and combinations thereof.

The method 400 proceeds to an optional step 408 by forming a capping layer 208 on the barrier layer 206, as shown in FIG. 2A. In some embodiments, the capping layer 208 is deposited by one or more processes selected from the group consisting of PVD, CVD, ALD, laser deposition, ion beam deposition, spin-on coating process, MOD, and combinations thereof.

The method 400 then proceeds to step 410 by forming an absorber layer 210 on the capping layer 208 (e.g., FIG. 2A), or on the barrier layer 206 (e.g., FIG. 3A). In some embodiments, the absorber layer 210 is deposited by one or more processes selected from the group consisting of PVD, CVD, ALD, laser deposition, ion beam deposition, spin-on coating process, MOD, and combinations thereof.

At step 412 of the method 400, the absorber layer 210 is etched to form the main pattern according to an IC design layout. In some embodiments, before removing the portions of the absorber layer 210, a lithography patterning process may be performed to define IC patterns on the blank mask 200 of FIG. 2A or the blank mask 300 of FIG. 3A. The patterning process may include resist coating (e.g., spin-on coating), soft baking, target aligning, exposure, post-exposure baking, developing the resist, rinsing, drying (e.g., hard baking), other suitable processes, and/or combinations thereof. Alternatively, the photolithography exposing process may be implemented or replaced by other proper methods such as maskless photolithography, electron-beam writing, direct-writing, and/or ion-beam writing.

At step 412, a portion of the absorber layer 210 is etched. With the patterned resist layer serving as an etching mask, the absorber layer 210 is etched through the openings of the patterned resist layer while the portion of the absorber layer 210 covered by the resist layer remains. After the etching process, the patterned resist layer may be removed by a suitable technique, such as stripping or ashing.

In some embodiments, the barrier layer 206 and/or the capping layer 208 has adequate etching selectivity over the absorber layer 210, so that the absorber layer 210 can be selectively etched while the barrier layer 206 and/or the capping layer 208 remain unetched. In some embodiments, the absorber layer 210 is etched using one or more processes selected from the group consisting of dry etching, wet etching, and combinations thereof. In some embodiments, a dry etching process may be performed to the absorber layer 210 using one or more gases selected from the group consisting of $Cl_2$, $Cl_2/O_2$, $SF_6$, $NF_3$, $CF_4$, $CHF_3$, and combinations thereof.

Method 400 proceeds to step 414 by etching the barrier layer 206. In some embodiments, the barrier layer 206 is etched using the patterned absorber layer 210 as an etching mask. In some embodiments, the barrier layer 206 and the capping layer 208 are etched at step 414 as shown in FIG. 2B. In some embodiments, the barrier layer 206 is etched at step 414 as shown in FIG. 3B. In some embodiments, the capping layer 208 and/or the barrier layer 206 are etched using one or more processes selected from the group consisting of dry etching, wet etching, and combinations thereof. In some embodiments, a dry etching process may be performed to the capping layer 208 and/or the barrier layer 206 using one or more gases selected from the group consisting of $Cl_2$, $Cl_2/O_2$, $O_2$, $SF_6$, $NF_3$, $CF_4$, $CHF_3$, and combinations thereof. In some embodiments, the capping layer 208 and the barrier layer 206 may include materials having different etching properties, so that the capping layer 208 and the barrier layer 206 can be etched using separate etching processes.

It is to be understood that although a multi-step etching process (e.g., step 412 and step 414 of method 400) are discussed in the present disclosure, a one-step etching process may also be performed to etch the underlying layers (e.g., the absorber layer 210, the capping layer 208, and the barrier layer 206) together. Because the barrier layer 206 has adequate etching selectivity in comparison with the ML 204, the absorber layer 210, the capping layer 208, and the barrier layer 206 can be etched in a single step, while leaving the ML 204 unetched in the one-step etching process. The detailed discussion of the multi-step etching process and the one-step etching process may also be found, for example, in U.S. application Ser. No. 13/564,334 entitle "Method of Fabricating A Lithography Mask", which is incorporated herein by reference.

Figure 5:
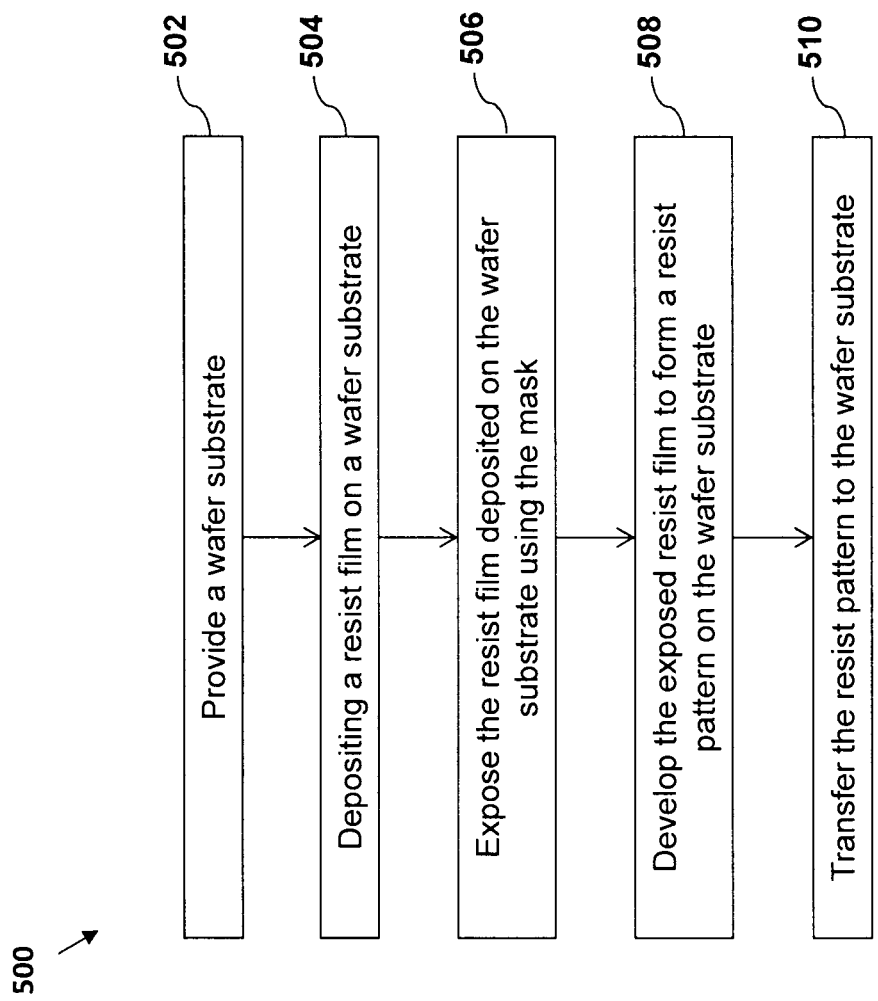
FIG. 5 is a flow chart showing a method for forming a semiconductor device on a wafer substrate using the system of FIG. 1 and the lithography mask fabricated using method of FIG. 4, according to one or more embodiments of the present disclosure.

FIG. 5 is a flow chart illustrating a method 500 for forming a semiconductor device using the system 100 of FIG. 1 and the lithography mask 200 or mask 300 fabricated using method 400 of FIG. 4, according to one or more embodiments of the present disclosure. It is understood that additional steps can be provided before, during, and after the method 500, and some steps described can be replaced, eliminated, or moved around for additional embodiments of the method. The method 500 is an example, and is not intended to limit the present disclosure beyond what is explicitly recited in the claims.

The method 500 begins at step 502 by providing a wafer substrate (not shown). In some embodiments, the wafer substrate may include a silicon wafer. In some embodiments, the wafer substrate may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some embodiments, the wafer substrate may include a semiconductor on insulator (SOI) structure. In some embodiments, the wafer substrate may also include one or more conductive and/or dielectric films. In some embodiments, the dielectric film may include silicon oxide, high k dielectric material film, or a combination of silicon oxide and high k dielectric material, and the conductive thin film for the gate electrode film may include doped polysilicon, or a metal, such as aluminum (Al), copper (Cu), tungsten (W), nickel (Ni), titanium (Ti), gold (Au), platinum (Pt) or alloy of the metals thereof.

The method 500 proceeds to step 504 by depositing a resist film (not shown) on the wafer substrate. The resist film may include a positive resist or a negative resist. The resist film may include a single layer resist film or a multiple layer resist film. The resist film may be deposited on the wafer substrate using a coating process, for example a spin-on process. In some embodiments, depositing the resist film may include performing a dehydration process before applying the resist on the substrate, which can enhance an adhesion of the resist film to the wafer substrate. The dehydration process may include baking the wafer substrate at a high temperature for duration of time, or applying a chemical such as hexamethyldisilizane (HMDS) to the substrate. In some embodiments, depositing the resist film may also include a soft bake process to drive a solvent out of a resist film and increase mechanical strength of a resist film. In some embodiments, depositing the resist film may include applying an antireflective coating, such as a bottom antireflective coating (BARC) or a top antireflective coating (TARC).

The method 500 proceeds to step 506 by exposing the resist film deposited on the wafer substrate. In some embodiments, the resist film deposited on the wafer substrate is exposed by a patterned radiation beam. In some embodiments, the patterned radiation beam may be generated using the lithography mask 200 or mask 300 including the barrier layer 206.

The method 500 proceeds to step 508 by developing the exposed resist film on the wafer substrate. At step 508, a developer may be applied on the exposed resist film to form a resist pattern on the wafer substrate. In some embodiments, the developer may include a water based developer, such as tetramethylammonium hydroxide (TMAH), for a positive tone development (PTD). In some alternative embodiments, the developer may include an organic solvent or a mixture of organic solvents, such as methyl a-amyl ketone (MAK) or a mixture involving the MAK, for a negative tome development (NTD). In some embodiments, the developer may be applied by spraying a developer on the exposed resist film, for example by a spin-on process. In some embodiments, step 508 may also include using a post exposure bake (PEB), a post develop bake (PDB) process, or a combination thereof.

The method 500 proceeds to step 510 by transferring the resist pattern to the wafer In some embodiments, transferring the resist pattern to the wafer includes performing an etching process to the wafer using the resist pattern as a mask, removing the resist, and forming a pattern or feature on the wafer. The etching process may include a dry (plasma) etching, a wet etching, a combination thereof, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching process may further include using a cleaning process.

The present embodiments describe one or more mechanisms of a lithography mask. The one or more embodiments of the lithography mask introduced in the present disclosure include a barrier layer formed between the reflective ML and the capping layer, or between the reflective ML and the absorber layer. The barrier layer can prevent inter-diffusion between the reflective ML and the capping layer, or between the reflective ML and the absorber layer of the lithography mask. The mechanisms include depositing a barrier layer on the reflective ML in a blank mask, and then etching the absorber layer and the barrier layer to form the lithography mask using one or more etching processes.

The present disclosure provides embodiments of a lithography mask comprising a substrate, a reflective multiplayer (ML) on the substrate, a barrier layer on the reflective ML, and an absorber layer over the barrier layer. In some embodiments, a thickness of the barrier layer is less than or equal to about 10 nm. In some embodiments, a portion of the absorber layer and a portion of the barrier layer are removed.

The present disclosure also provides some embodiments of a method for lithography comprising receiving a lithography mask; depositing a resist film on a substrate; and exposing the resist film on the substrate to a patterned radiation beam, the patterned radiation beam being generated using the lithography mask. In some embodiments, the lithography mask includes a low thermal expansion material (LTEM) substrate; a reflective multilayer (ML) on the LTEM substrate; a barrier layer on the reflective ML; and an absorber layer over the barrier layer. In some embodiments, a thickness of the barrier layer is less than or equal to about 10 nm. In some embodiments, a portion of the absorber layer and a portion of the barrier layer that is aligned with the portion of the absorber layer are removed.

The present disclosure also provides some embodiments of a method for fabricating a lithography mask comprising providing a substrate; forming a reflective multilayer (ML) on the substrate; forming a barrier layer on the reflective ML; forming an absorber layer on the barrier layer; and etching the absorber layer to remove a portion of the absorber layer; and etching the barrier layer to remove a portion of the barrier layer that is aligned with the portion of the absorber layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography mask, comprising:
a substrate;
a reflective multilayer (ML) on the substrate; and
a barrier layer on the reflective ML;
wherein the barrier layer includes at least one material selected from the group consisting of ruthenium nitride, aluminum nitride, boron nitride, and a combination thereof.

2. The lithography mask of claim 1, wherein a thickness of the barrier layer is less than or equal to about 10 nm.

3. The lithography mask of claim 1, wherein the barrier layer includes one of: an oxide material, a nitride material, or an alloy material.

4. The lithography mask of claim 1, further comprising, an absorber layer over the barrier.

5. The lithography mask of claim 1, wherein the barrier layer is patterned.

6. The lithography mask of claim 1, further comprising:
a capping layer formed between the barrier layer and an absorber layer.

7. The lithography mask of claim 6, wherein the capping layer is patterned.

8. The lithography mask of claim 1, wherein the substrate includes low thermal expansion material (LTEM).

9. The lithography mask of claim 1, wherein the reflective ML includes one or more film pairs selected from the group consisting of molybdenum-silicon (Mo/Si) film pairs, and molybdenum-beryllium (Mo/Be) film pairs.

10. The lithography mask of claim 1, further comprising an absorber layer that includes one or more materials selected from the group consisting of chromium (Cr), chromium oxide (CrO), titanium nitride, tantalum nitride, tantalum (Ta), titanium (Ti), aluminum-copper (Al—Cu), palladium (Pd), tantalum boron nitride, aluminum oxide, molybdenum (Mo), and a combination thereof.

11. A method for patterning a substrate, the method comprising:
receiving a lithography mask;
depositing a resist film on the substrate; and
exposing the resist film to a patterned radiation beam, the patterned radiation beam being generated using the lithography mask,
wherein the lithography mask includes:
a low thermal expansion material (LTEM) substrate;
a reflective multilayer (ML) on the LTEM substrate; and
a barrier layer on the reflective ML; and
wherein the barrier layer is configured to prevent interdiffusion between an absorber layer and the reflective multilayer, wherein the barrier layer includes at least one material selected from the group consisting of ruthenium nitride, aluminum nitride, boron nitride, and a combination thereof.

12. The method of claim 11, wherein the lithography mask further includes the absorber layer over the barrier layer, a portion of the absorber layer and a portion of the barrier layer that is aligned with the portion of the absorber layer being removed.

13. The method of claim 11, wherein the lithography mask further includes a capping layer formed between the barrier layer and the absorber layer, a portion of the capping layer that is aligned with the portion of the absorber layer is removed.

14. The method of claim 11, wherein the barrier layer includes an oxide material $MO_x$, where M is an element selected from the group consisting of ruthenium (Ru), hafnium (Hf), aluminum (Al), boron (B).

15. The method of claim 11, wherein the barrier layer includes a nitride material $MN_x$, where M is an element selected from the group consisting of ruthenium (Ru), hafnium (Hf), aluminum (Al), boron (B).

16. The method of claim 11, wherein the barrier layer includes an alloy material $M1_xM2_y$, where each of M1 and M2 is an element selected from the group consisting of ruthenium (Ru), hafnium (Hf), aluminum (Al), boron (B).

17. A method of fabricating a lithography mask, the method comprising:
providing a substrate;
forming a reflective multilayer (ML) on the substrate;
forming a barrier layer on the reflective ML;
etching the barrier layer to remove a portion of the barrier layer;
wherein the barrier layer is configured to prevent interdiffusion between an absorber layer and the reflective multilayer, wherein the barrier layer includes at least one material selected from the group consisting of ruthenium nitride, aluminum nitride, boron nitride, and a combination thereof.

18. The method of claim 17, further comprising:
forming a capping layer between the absorber layer and the barrier layer.

19. The method of claim 18, further comprising:
etching the capping layer to remove a portion of the barrier layer that is aligned with the absorber layer.

20. The method of claim 17, wherein the barrier layer includes ruthenium.

\* \* \* \* \*